(12) United States Patent
Bordow

(10) Patent No.: US 7,561,981 B2
(45) Date of Patent: Jul. 14, 2009

(54) MULTIPLE INDEPENDENT MEASUREMENTS OF EVENTS FROM MULTIPLE MEASUREMENT SETUPS ENTERED AT A SINGLE TIME

(75) Inventor: Robin A. Bordow, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/738,317

(22) Filed: Apr. 20, 2007

(65) Prior Publication Data

US 2008/0262779 A1 Oct. 23, 2008

(51) Int. Cl.
*G06F 15/00* (2006.01)
(52) U.S. Cl. ..................................... 702/127
(58) Field of Classification Search ............. 702/57, 702/64, 66, 74, 80, 116–119, 123, 127, 183, 702/189; 711/110; 324/76.61, 76.63, 606
See application file for complete search history.

(56) References Cited

U.S. PATENT DOCUMENTS

2007/0226406 A1* 9/2007 Beale et al. ................. 711/110

* cited by examiner

*Primary Examiner*—Edward Raymond
*Assistant Examiner*—Mohamed Charioui

(57) ABSTRACT

A method and apparatus for making multiple independent measurements of events from multiple measurement setups entered at a single time. A measurement instrument receives N measurement setups to make N measurements of an input signal, where N is an integer greater than or equal to one. A memory is divided into N partitions, each of the N partitions corresponding to one of the N measurements. A first measurement is run on the input signal, the first measurement selected from the N measurements. The data from the first measurement is stored in a first partition selected from the N partitions.

19 Claims, 3 Drawing Sheets

MULTIPLE INDEPENDENT MEASUREMENTS OF EVENTS FROM MULTIPLE MEASUREMENT SETUPS ENTERED AT A SINGLE TIME

BACKGROUND

Measurement instruments are often used to measure transient or intermittent signals that occur rarely and at unpredictable times. It is often useful to make multiple independent measurements on such signals using different measurement parameters to obtain different perspectives. The various measurement parameters that must be specified to run a measurement on a measurement instrument shall hereinafter be collectively referred to as a "measurement setup". Current measurement instruments (including spectrum analyzers, oscilloscopes, network analyzers, logic analyzers, etc.) allow a user to enter only a single measurement setup at a time. The user must wait for a desired signal to occur and a measurement of the desired signal to be made, before entering a new measurement setup into the instrument again to make a subsequent measurement. However, if the desired signal is unpredictable or infrequent, the user may not be present after a measurement occurs to enter a new measurement setup, and may miss other occurrences of the desired signal. Even if the user is present, the input process wastes valuable time during which other occurrences of the signal may not be captured as a result.

A user enters a measurement setup by providing the measurement instrument with parameters such as what trigger event to look for, how much data to collect before the trigger event, how much data to store after the trigger event, which sample rate or bandwidth to use, etc. Current measurement instruments only make a single measurement based on a single measurement setup using a single section of memory. Sometimes these single measurements are the result of multiple data collections averaged together, but what has been lacking is the ability to make multiple independent measurements all entered by the user at one time, and to be able to independently recall and analyze all the data from those measurements afterwards.

FIG. 1 shows a simplified block diagram for a typical prior art measurement instrument 10. A central processing unit (CPU) 11 controls data acquisition circuitry 15, a direct memory access (DMA) controller 16, and trigger circuitry 17 to acquire data from an input signal 12 according to a measurement setup 14 that is entered by a user. Entering the measurement setup 14 includes programming parameters such as the trigger event, the amount of data to be captured before and after the trigger event, the center frequency and gain for the signal, the measurement bandwidth, the sample rate, etc. The input signal 12 is applied to the data acquisition circuitry 15, while other trigger signals 13 are applied to the trigger circuitry 17. A trigger event may consist of either the occurrence of an attribute of the input signal 12 or an occurrence of one or more trigger signals 13 as determined by the measurement setup 14.

The CPU 11 controls the DMA controller 16 to begin storing pre-trigger data in the memory 18 in a circular fashion. When the number of pre-trigger points specified in the measurement setup 14 have been captured, the CPU 11 or DMA controller 16 arms the trigger circuitry 17 and data acquisition circuitry 15 to monitor the input signal 12 and trigger signals 13 to check for the trigger event. If no pre-trigger points are required, the trigger circuitry 17 and data acquisition circuitry 15 are armed prior to the capture of the first point. Once the trigger event is detected, the DMA controller 16 stores the trigger point and the post-trigger data captured according to the measurement setup 14 into the memory 18. The data acquisition circuitry 15 may also do signal processing such as filtering or decimation on the acquired input signal 12 as determined by the measurement setup 14, before forwarding the data to the DMA controller 16.

FIG. 2 shows an exploded view of the memory 18 in FIG. 1. Memory 18 is typically random access memory (RAM) but may be any circularly writable storage medium able to keep up with the sampled data. The memory 18 is typically configured as a circular buffer—as indicated by the arrow 20, the DMA controller 16 writes data to the memory 18 from beginning to end. When the DMA controller 16 reaches the end of the memory 18, it loops back to the beginning to write anew. Wrapping back to the beginning to write anew includes writing over any previously stored data in the memory 18.

Even before the trigger event occurs, the DMA controller 16 stores measurement data acquired from the input signal 12 into the memory 18. This measurement data is categorized as "pre-trigger" data in FIG. 2. The DMA controller 16 will store pre-trigger data and loop as needed, repeatedly, until the user-specified trigger event occurs. Once the trigger event occurs (shown as "trigger" in FIG. 2), additional measurement data ("post-trigger" in FIG. 2) is stored according to the measurement setup 14 until the specified amount of data has been captured and the measurement ends. No more data is taken until another measurement setup 14 is entered. The DMA controller 16 saves the memory address at which the trigger has been stored. This is used later by the CPU 11 to interpret the contents of the memory 18. The combined number of pre-trigger and post-trigger points plus one (for the trigger point itself) should be less than or equal to the size of the memory 18.

The prior art instrument in FIG. 1 is only capable of making a single measurement based on a single measurement setup 14. Some prior art instruments are capable of averaging, histogramming, or gating sampled data from multiple triggers and multiple data acquisitions into a single measurement result. However, the sampled data associated with each acquisition is not individually saved for independent analysis, and the measurement parameters for each acquisition within the measurement are identical.

In some prior art configurations, an external computer is used with the measurement instrument to make multiple independent measurements. In these cases the external computer must copy measurement data out of the memory of the measurement instrument, and then reprogram the instrument for the next measurement. This process, though automated, takes time and potentially results in a loss of measurement opportunities.

Therefore, there remains a need for a measurement instrument that can make multiple independent measurements from multiple measurement setups that are entered at a single time, and can store all of the acquired measurement data in its own memory space.

DETAILED DESCRIPTION

Figure 3:
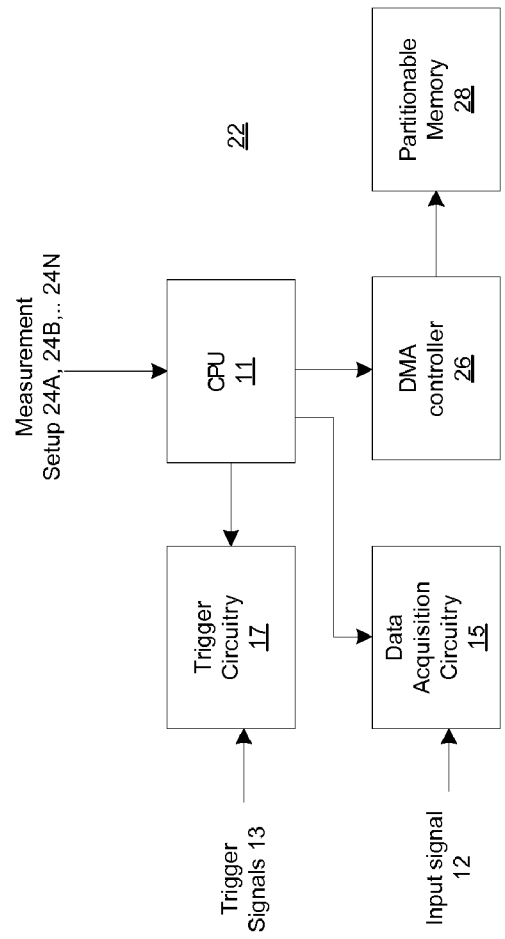
FIG. 3 shows a simplified block diagram for a measurement instrument according to an embodiment of the present invention.

FIG. 3 shows a simplified block diagram for a measurement instrument 22 according to an embodiment of the present invention. In contrast to the prior art, the measurement instrument 22 is capable of making multiple independent measurements from multiple measurement setups entered at a single time. The user can also enter multiple measurement setups at various different times, so long as they are all entered before the first of the measurements is performed.

A central processing unit (CPU) 11 controls trigger circuitry 17, data acquisition circuitry 15, and a direct memory access (DMA) controller 26. The measurement instrument 22 acquires data from an input signal 12 according to measurement setups 24A-N that are entered by a user, where N is any integer greater than or equal to one. Entering measurement setups 24A-N includes selecting a trigger event for each of the N measurement setups, specifying the amount of data to be captured before and after each trigger event, as well as other measurement attributes including but not limited to sample rate, measurement bandwidth, detection mode, signal gain, center frequency, etc. The trigger event or other measurement attributes can be the same for each measurement. In one embodiment, the trigger event or other measurement attributes can differ from measurement to measurement. The CPU 11 controls a DMA controller 26 to store measurement data into a partitionable memory 28.

Figure 2:
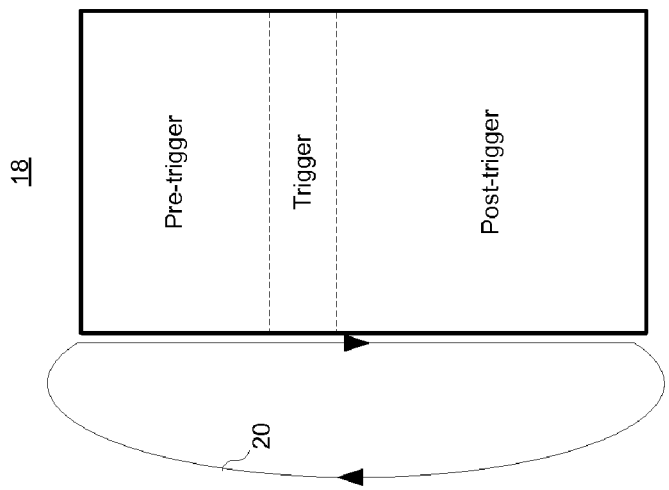
FIG. 2 shows an exploded view of the memory in FIG. 1.
Figure 1:
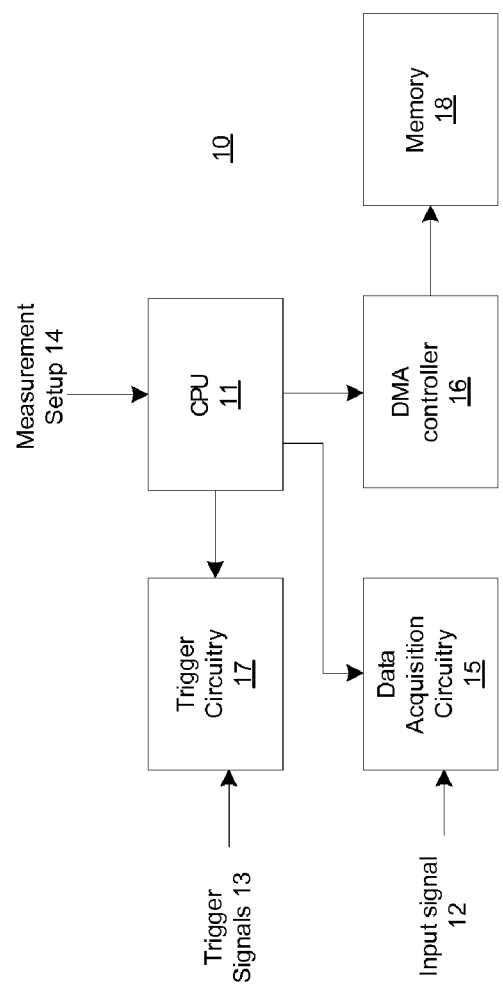
FIG. 1 shows a simplified block diagram for a typical prior art measurement instrument.
Figure 4:
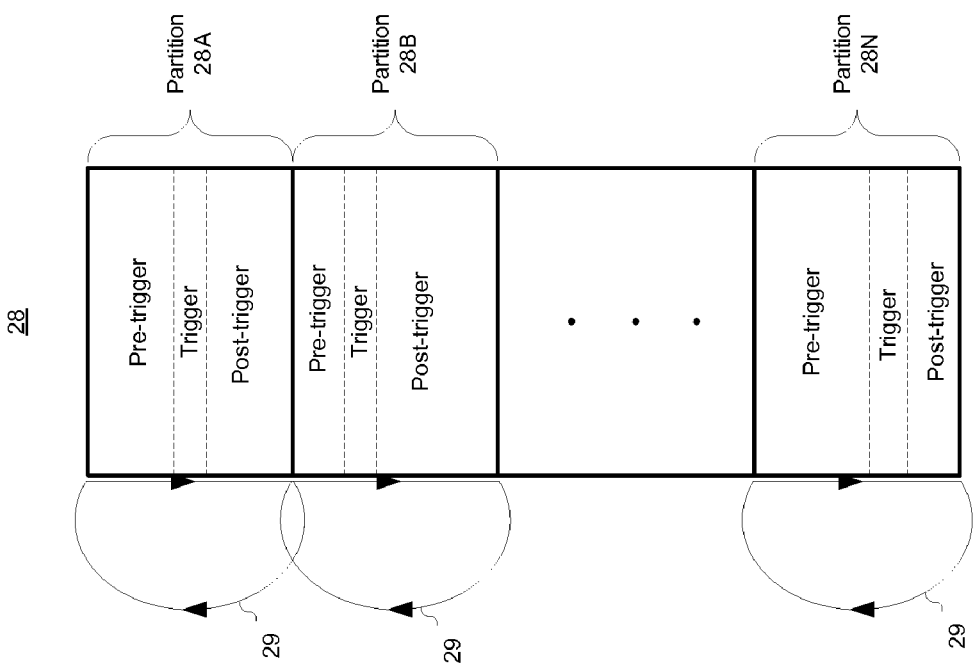
FIG. 4 shows an expanded view of the partitionable memory in FIG. 3.

FIG. 4 shows an expanded view of the partitionable memory 28 in FIG. 3. The partitionable memory 28 is divided into N partitions 28A-N, one partition for each measurement setup 24A-N. Each of the N partitions functions as an independent circular buffer, as indicated by arrows 29. Once the measurement setups 24A-N are entered, the CPU 11 determines the number of partitions necessary to store data acquired from the measurements, and then programs the DMA controller 26. The DMA controller 26 has N register sets that are programmed by the CPU 11. Each register set has a start address register and a segment length register that define the location and size of a corresponding partition. Additionally, each register set includes a trigger address register for each of the N partitions. When the trigger event for a partition occurs, the memory address of the trigger point is saved in the corresponding trigger address register. A register that indicates whether the partition is the last of the N partitions is also provided so the DMA controller 26 will know when to end the process. Each register set also includes a pre-trigger register and a post-trigger register to control the number of pre-trigger and post-trigger points stored in the corresponding partition.

When the measurement setups 24A-N are similar, the DMA controller 26 can immediately switch from one memory partition to the next with no delay. Once the DMA controller 26 finishes writing the post-trigger points to one partition, it immediately begins writing pre-trigger points to the next partition with no delay or pause, so that no data is lost between measurements. This ability of the DMA controller 26 to move immediately from one partition of memory to another without delay or intervention by the CPU 11 is referred to as "chaining capability". If no pre-trigger points are required, the trigger circuitry 17 and data acquisition circuitry 15 are armed prior to the capture of the first point in the partition.

When the measurement setups 24A-N are different enough, the DMA controller 26 pauses in between memory partitions to allow the CPU 11 to reconfigure the measurement instrument. The pause by the DMA controller 26 should be for the least amount of time possible, but long enough for the CPU 11 to change the necessary measurement attributes for the next measurement setup.

This arrangement allows a user to enter N measurement setups at a single time. (The user can also enter N measurement setups at various different times, so long as they are all entered before the first of the N measurements is performed). Measurement instrument 22 is capable of making N measurements that gather N sets of measurement data according to the N measurement setups. Each of the N sets of measurement data is stored in its own memory partition 28A-N. The user need not be present to reprogram the measurement instrument 22 in between the N measurements, so no measurement opportunities are lost due to downtime in between measurements.

Figure 5:
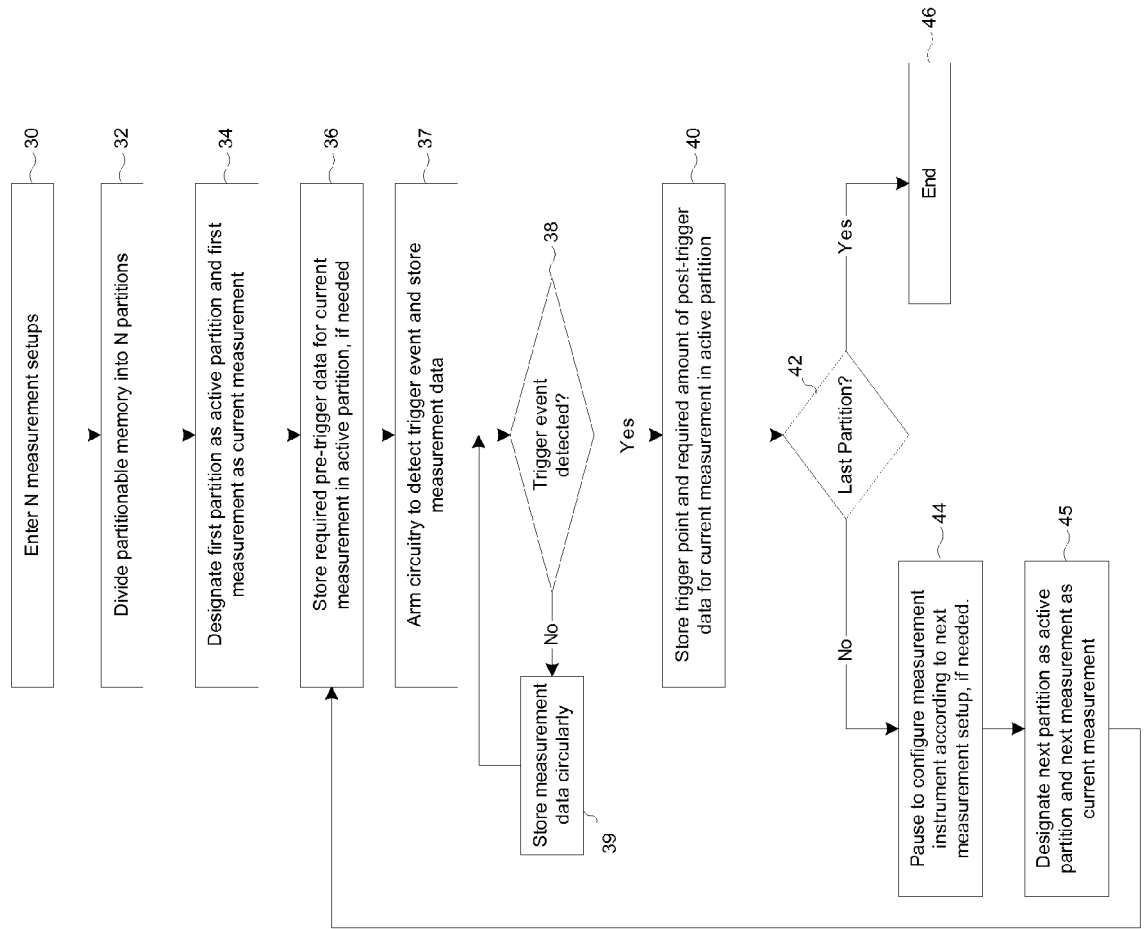
FIG. 5 is a flow chart that describes how the measurement instrument works with the partitionable memory.

FIG. 5 is a flow chart that describes how the measurement instrument 22 works with the partitionable memory 28. In step 30, the user enters N measurement setups at a time to run N measurements on the input signal 12. For each measurement setup, the user enters parameters including trigger events, amount of pre-trigger and post-trigger data to capture, etc. In step 32, the partitionable memory 28 is divided into N partitions, one partition for each of the N measurement setups entered by the user in step 30.

Next, in step 34, the first of N measurements is designated as the current measurement, and the first partition 28A is designated as the active partition for storing data from the current measurement. In step 36, the requested pre-trigger data for the current measurement is stored in the active partition by the DMA controller 26. If no pre-trigger points have been requested in the measurement setup, step 36 is skipped. In step 37, the trigger circuitry 17 or data acquisition circuitry 15 is armed to respond to a trigger event, and measurement data is stored while waiting for the trigger event to occur. If no trigger event is detected, measurement data continues to be stored in step 39 while a trigger event is pending. After the trigger event is detected, the next step is step 40, where the DMA controller 26 stores the trigger point and post-trigger data in the active partition until the requested amount of data has been captured.

In step 42, the DMA controller 26 determines whether the active partition is the last partition. If not, then proceed to step 44. In step 44, the DMA controller 26 pauses writing to the memory 28 long enough to let the CPU 11 configure the measurement instrument according to the new measurement setup. Step 44 may be skipped if the new measurement setup is the same as or similar enough to the previous measurement setup that no reconfiguration of the measurement instrument is necessary. Then in step 45, the next memory partition (partition 28B in FIG. 4) is designated as the active partition, and the next measurement is designated the current measurement. The DMA controller 26 jumps to the next memory partition (the newly-designated "active partition") and begins storing the pre-trigger data for the next measurement (the newly-designated "current measurement") in a return to step 36. Steps 36-45 are repeated until the last partition is reached and no measurements remain. Once the last partition has been filled, the process ends (step 46).

In this manner, independent measurement data from multiple measurement setups can be captured by the measurement instrument. Furthermore, the measurement data from all the measurements are saved and available—the partitioning of the memory means no measurement data is overwritten or lost. It should be noted that the number of measurements N that can be set up at a single time is limited by the size of the partitionable memory 28 and the number of partitions that can reasonably be created for the partitionable memory.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. A method for operating a measurement instrument to measure an input signal, comprising:
   receiving N independent measurement setups to make N measurements of the input signal, where N is an integer greater than one;
   dividing a memory into N partitions, each of the N partitions corresponding to one of the N measurements;
   after receiving the N independent measurement setups, running a first measurement on the input signal, the first measurement selected from the N measurements; and
   storing data from the first measurement in a first partition selected from the N partitions,
   wherein at least of the N independent measurement setups includes a parameter that differs in one of the other (N−1) independent measurement setups.

2. A method as in claim 1, further comprising:
   running a second measurement on the input signal, the second measurement selected from the N measurements;
   transitioning from the first partition to a second partition selected from the N partitions; and
   storing data from the second measurement in the second partition.

3. A method as in claim 2, wherein the first and second measurements have similar parameters.

4. A method as in claim 3, wherein transitioning from the first partition to the second partition is immediate.

5. A method as in claim 2, wherein the first and second measurements have different parameters.

6. A method as in claim 5, wherein transitioning from the first partition to the second partition includes a delay to configure the measurement instrument for the second measurement.

7. A method as in claim 1, further comprising:
   configuring each partition as a circular buffer.

8. A method as in claim 7, storing the data further comprises:
   storing pre-trigger data, and
   storing post-trigger data.

9. A method as in claim 1, wherein the measurement instrument is selected from the group consisting of spectrum analyzers, oscilloscopes, network analyzers, and logic analyzers.

10. A method as in claim 1, wherein all N measurement setups are received at substantially the same time.

11. A method as in claim 1, wherein the N independent measurement setups include at least one parameter selected from the group consisting of: trigger event, sample rate, measurement bandwidth, detection mode, signal gain, and center frequency.

12. An apparatus, comprising:
    data acquisition circuitry that receives an input signal;
    a central processing unit (CPU) that receives N independent measurement setups prior to making N measurements on the input signal, where N is an integer greater than one, and where at least one of the N independent measurement setups includes a parameter that differs in one of the other (N−1) independent measurement setups;
    a memory that can be divided into N partitions; and
    a direct memory access (DMA) controller that runs N measurements on the input signal and stores data from each of the N measurements into a corresponding partition selected from the N partitions.

13. An apparatus as in claim 12, wherein the DMA controller further includes N register sets, each of the N register sets describing the corresponding partition.

14. An apparatus as in claim 13, wherein each of the N register sets further includes:
    a start address register that describes location;
    a segment length register that describes size;
    a trigger address register;
    a register that indicates if the corresponding partition is last of the N partitions;
    a pre-trigger register that indicates how many pre-trigger points are required; and
    a post-trigger register that indicates how many post-trigger points are required.

15. An apparatus as in claim 12, wherein the DMA controller has chaining capability.

16. An apparatus as in claim 12, wherein each of the N partitions is a circular buffer.

17. An apparatus as in claim 12, wherein the DMA controller pauses after storing data to a current partition and before storing data to a next partition, to allow the CPU to implement a measurement setup corresponding to the next measurement.

18. An apparatus as in claim 12, wherein the DMA controller transitions immediately between storing data to a current partition and storing data to a next partition.

19. An apparatus as in claim 12, wherein the apparatus is a measurement instrument selected from the group consisting of spectrum analyzers, oscilloscopes, network analyzers, and logic analyzers.

* * * * *

UNITED STATES PATENT AND TRADEMARK OFFICE
CERTIFICATE OF CORRECTION

| | | |
|---|---|---|
| PATENT NO. | : 7,561,981 B2 | Page 1 of 1 |
| APPLICATION NO. | : 11/738317 | |
| DATED | : July 14, 2009 | |
| INVENTOR(S) | : Robin A. Bordow | |

It is certified that error appears in the above-identified patent and that said Letters Patent is hereby corrected as shown below:

In column 5, line 24, in Claim 1, delete "of" and insert -- one of --, therefor.

Signed and Sealed this

Twenty-second Day of September, 2009

David J. Kappos
*Director of the United States Patent and Trademark Office*